United States Patent
Zhu

(10) Patent No.: US 10,475,935 B2
(45) Date of Patent: Nov. 12, 2019

(54) NANOMETER SEMICONDUCTOR DEVICES HAVING HIGH-QUALITY EPITAXIAL LAYER

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 15/371,431

(22) Filed: Dec. 7, 2016

(65) Prior Publication Data

US 2017/0162714 A1 Jun. 8, 2017

(30) Foreign Application Priority Data

Dec. 7, 2015 (CN) .......................... 2015 1 0888321

(51) Int. Cl.
| | |
|---|---|
| *H01L 29/786* | (2006.01) |
| *H01L 29/06* | (2006.01) |
| *H01L 29/423* | (2006.01) |
| *H01L 29/49* | (2006.01) |
| *H01L 29/66* | (2006.01) |
| *H01L 29/775* | (2006.01) |
| *B82Y 10/00* | (2011.01) |
| *H01L 29/10* | (2006.01) |

(52) U.S. Cl.
CPC ........ *H01L 29/78696* (2013.01); *B82Y 10/00* (2013.01); *H01L 29/0673* (2013.01); *H01L 29/1079* (2013.01); *H01L 29/42392* (2013.01); *H01L 29/4966* (2013.01); *H01L 29/66439* (2013.01); *H01L 29/66742* (2013.01); *H01L 29/775* (2013.01); *H01L 29/78651* (2013.01); *H01L 29/78681* (2013.01); *H01L 29/78684* (2013.01)

(58) Field of Classification Search
CPC ......... H01L 29/78696; H01L 29/42392; H01L 29/78651; H01L 29/0673; H01L 29/78681; H01L 29/78684; H01L 29/4966; H01L 29/66742
See application file for complete search history.

(56) References Cited

U.S. PATENT DOCUMENTS

| | | | | |
|---|---|---|---|---|
| 2007/0029586 A1* | 2/2007 | Orlowski | ............... | B82Y 10/00 257/287 |
| 2013/0279145 A1* | 10/2013 | Then | ................. | H01L 29/66431 361/820 |
| 2015/0035071 A1* | 2/2015 | Ching | ................... | H01L 27/092 257/369 |

* cited by examiner

*Primary Examiner* — Laura M Menz
*Assistant Examiner* — Candice Chan
(74) *Attorney, Agent, or Firm* — Schwegman Lundberg & Woessner, P.A.

(57) ABSTRACT

There are provided a nanometer semiconductor device with a high-quality epitaxial layer and a method of manufacturing the same. According to an embodiment, the semiconductor device may include: a substrate; at least one nanowire spaced apart from the substrate; at least one semiconductor layer, each formed around a periphery of respective one of the at least one nanowire to at least partially surround the corresponding nanowire, wherein the semiconductor layer(s) formed around the respective nanowire(s) are separated from each other; an isolation layer formed on the substrate, exposing the at least one semiconductor layer; and a gate stack formed on the isolation layer and intersecting the at least one semiconductor layer, wherein the gate stack includes a gate dielectric layer at least partially surrounding a periphery of respective one of the at least one semiconductor layer and a gate conductor layer.

15 Claims, 17 Drawing Sheets

NANOMETER SEMICONDUCTOR DEVICES HAVING HIGH-QUALITY EPITAXIAL LAYER

CROSS-REFERENCE TO RELATED APPLICATION

This application claims priority to Chinese Patent Application No, 201510888321.4, filed on Dec. 7, 2015, entitled "NANOMETER SEMICONDUCTOR DEVICES HAVING HIGH-QUALITY EPITAXIAL LAYER AND METHODS OF MANUFACTURING THE SAME," which is incorporated herein by reference in its entirety.

TECHNICAL FIELD

The present disclosure relates to the field of semiconductors, and particularly to nanometer semiconductor devices having a high-quality epitaxial layer and methods of manufacturing the same.

BACKGROUND

With the development of semiconductor devices, it is desirable to manufacture high-performance semiconductor devices such as Metal-Oxide-Semiconductor Field-Effect Transistors (MOSFETs) using a semiconductor material of higher mobility than that of Si. However, it is difficult to form a high-quality semiconductor material of high mobility.

SUMMARY OF THE DISCLOSURE

In view of the above, the present disclosure aims to provide, among others, a semiconductor device having a high-quality epitaxial layer and a method of manufacturing the same.

According to an aspect of the present disclosure, there is provided a semiconductor device, comprising: a substrate; at least one nanowire spaced apart from the substrate; at least one semiconductor layer, each formed around a periphery of respective one of the at least one nanowire to at least partially surround the corresponding nanowire, wherein the semiconductor layer(s) formed around the respective nanowire(s) are separated from each other; an isolation layer formed on the substrate, exposing the at least one semiconductor layer; and a gate stack formed on the isolation layer and intersecting the at least one semiconductor layer, wherein the gate stack includes a gate dielectric layer at least partially surrounding a periphery of respective one of the at least one semiconductor layer and a gate conductor layer.

According to an aspect of the present disclosure, there is provided a semiconductor device, comprising: a substrate; at least two nanowires spaced apart from the substrate, wherein the at least two nanowires are arranged in a direction substantially perpendicular to a surface of the substrate, and the at least two nanowires are separated from each other and extend substantially parallel to each other, and among them, at least one pair of neighboring nanowires have a crystalline structure in mirror symmetry relative to a middle line therebetween; an isolation layer formed on the substrate, exposing the at least two nanowires; and a gate stack formed on the isolation layer and intersecting the at least two nanowires, wherein the gate stack includes a gate dielectric layer at least partially surrounding a periphery of respective one of the at least two nanowires and a gate conductor layer.

According to a further aspect of the present disclosure, there is provided a method of manufacturing a semiconductor device, comprising: forming a fin structure on a substrate; forming a supporting layer on the substrate having the fin structure formed thereon, and patterning the supporting layer into a supporting portion extending from a surface of the substrate to a surface of the fin structure and thereby physically connecting the fin structure to the substrate; removing a portion of the fin structure, to form at least one nanowire spaced apart from the substrate; and growing a semiconductor layer/semiconductor layers with respective one of the at least one nanowire as a seed layer.

According to a still further aspect of the present disclosure, there is provided a method of manufacturing a semiconductor device, comprising: forming a fin structure on a substrate; forming a supporting layer on the substrate having the fin structure formed thereon, and patterning the supporting layer into a supporting portion extending from a surface of the substrate to a surface of the fin structure and thereby physically connecting the fin structure to the substrate; removing a portion of the fin structure, to form at least one nanowire spaced apart from the substrate; growing a semiconductor layer/semiconductor layers with respective one of the at least two nanowire as a seed layer; forming a mask layer between the substrate and one of the semiconductor layer(s) closest to the substrate as well as between the respective semiconductor layers; selectively etching the respective semiconductor layer(s) with the at least one nanowire and the mask layer as a mask, so that portions of the semiconductor layer(s) between the respective nanowire(s) and the mask layer are remained; and selectively removing the nanowire(s) and the mask layer.

According to embodiments of the present disclosure, the semiconductor layer can be grown with the nanowire(s) suspended relative to the substrate as a seed layer, and the semiconductor layer can have high mobility. Such a suspended seed layer can enable relaxation of stresses in the nanowire(s) and the semiconductor layer, thereby contributing to suppress defects in the nanowire(s) or the semiconductor layer.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
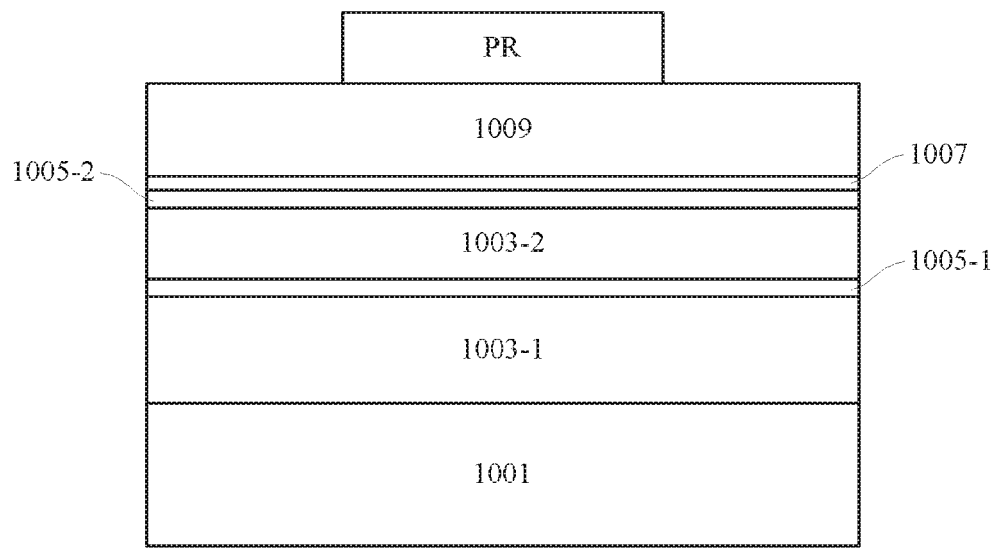
FIGS. 1-15 are schematic views illustrating a flow of manufacturing a semiconductor device according to an embodiment of the present disclosure.

Hereinafter, embodiments of the present disclosure will be described with reference to the attached drawings. However, it should be understood that those descriptions are provided for illustrative purpose only, rather than limiting the scope of the present disclosure. Further, in the following, descriptions of known structures and techniques might be omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, there is provided a semiconductor device having a suspended fin structure. In particular, the device has a fin suspended relative to a substrate. Here, the so-called "suspended" refers to that the fin is spaced apart from the substrate. It is to be noted that a spacing between the fin and the substrate may be filled with another material (for example, an isolation layer). The fin may comprise a semiconductor material of high mobility, to improve performances of the device. Here, the so-called "high mobility" refers to higher mobility than that of Si. The semiconductor material of high mobility comprises, for example, Ge, SiGe, a III-V compound semiconductor, or the like.

The fin may be a semiconductor layer formed (for example, epitaxially grown) on a nanowire above and spaced apart from the substrate. Herein, the "nanowire" refers to a line-shaped structure, having a longitudinally extending length much greater than a dimension of its cross section, which cross section is at the nanoscale. The nanowire may be suspended relative to the substrate, e.g., extending substantially parallel to a surface of the substrate. Then, the semiconductor layer may be formed to at least partially surround a periphery of the nanowire, so that the semiconductor layer extends along the substantially same direction as the nanowire (thereby in a fin shape) and may then be used as the fin of the device. Here, the so-called "partially surround(ing)" refers to that there may be an extent of the nanowire in a longitudinal direction thereof, in which extent the semiconductor layer can completely enclose an external surface of the nanowire. That is, in this extent, the semiconductor layer may form a closed pattern on a cross section perpendicular to the longitudinal direction of the nanowire, for example, a rectangle, a polygon or the like corresponding to a shape of a cross section of the nanowire. Of course, except for the surface of the nanowire covered by a supporting portion, remaining surfaces of the nanowire may also be covered by the semiconductor layer. The nanowire may be relatively thin (for example, with a thickness of about 3-20 nm) and is suspended relative to the substrate. In this way, stresses in the nanowire and the semiconductor layer can be relaxed in the growth process, and therefore it is possible to suppress or avoid defects occurring in the nanowire or the semiconductor layer.

Alternatively, the fin may be a portion of the semiconductor layer, which is formed as stated above, arranged on the upper side and/or lower side of the nanowire. Remaining portions of the semiconductor layer, e.g., portions arranged on the left side and right side of the nanowire, and the nanowire may be removed. In this way, the fin may be in a form of a nanometer wire. For a semiconductor layer grown with the same nanowire as a seed, its portions arranged on the upper and lower sides of the nanowire may be grown from upper and lower side surfaces of the nanowire, respectively, so that they can have a crystalline structure in substantially mirror symmetry relative to a middle line therebetween.

The nanowire may be physically connected to the substrate by a supporting portion and thus is supported by the substrate. A portion of the nanowire connected to the supporting portion may have an extent in the longitudinal direction of the nanowire less than a length of the nanowire in the longitudinal direction. In this way, when only the nanowire, the substrate and the supporting portion are observed as to their positional relationship (without considering other layer structures), the nanowire is similar to a cantilever, and the supporting portion is similar to an anchor of the cantilever.

The supporting portion may comprise a laterally extending portion extending along the surface of the substrate and a vertically extending portion extending in a direction substantially perpendicular to the surface of the substrate. The vertically extending portion extends onto vertical sidewalls of the nanowire which are substantially perpendicular to the surface of the substrate. In this way, the nanowire is physically connected to the substrate via the supporting portion and thus is supported by the substrate. The vertically extending portion of the supporting portion may extend on the vertical sidewalls of the nanowire on opposite sides to sandwich the nanowire.

The supporting portion may be positioned at either one or both of opposite ends of the nanowire, or may be positioned in the middle of the nanowire.

The substrate may have an isolation layer formed thereon to electrically isolate a gate stack of the device from the substrate. The isolation layer may have a top surface closer to the substrate than a bottom surface of the lowest semiconductor layer/nanowire facing the substrate, thereby exposing the respective semiconductor layers/nanowires. In this way, the gate stack may surround the respective semiconductor layers/nanowires (i.e., a fin of the device).

The semiconductor device may be manufactured as follows, for example. Specifically, a fin structure may be formed on the substrate. Then, a portion of the fin structure is removed to obtain at least one nanowire spaced apart from the substrate, and the at least one nanowire can be suspended relative to the substrate.

In order to support the nanowire which is to be suspended, a supporting portion may be formed. This supporting portion may be formed as follows. Specifically, a supporting layer may be formed on the substrate with the fin structure formed thereon, and then patterned into the supporting portion which extends from a surface of the substrate to a surface of the fin structure and therefore physically connects the fin structure to the substrate. The supporting layer may be patterned with a mask. The mask extends on the fin structure beyond an extent of the fin structure in a direction perpendicular to a longitudinal direction of the fin structure (in this way, the mask can shield portions of the supporting layer extending on the surface of the substrate on opposite sides of the fin structure, so that those portions can then be remained); and the mask covers only a fraction of a length of the fin structure in the longitudinal direction (in this way, the mask shields only a fraction of a longitudinal extent of the fin structure, so that this portion can then be connected to the supporting portion). The mask may cover either one or both of opposite ends of the fin structure, or cover the middle of the fin structure, and the resulting supporting portion may correspondingly be positioned at either one or both of the ends of the fin structure or the middle of the fin structure.

Then, a portion of the fin structure may be removed to obtain a nanowire. For example, the fin structure may be separated into several portions in a direction substantially perpendicular to the surface of the substrate. These portions may extend along the longitudinal extending direction of the fin structure. Some of those portions are removed while remaining portions are kept, so that one or more nanowires may be formed. In this case, these nanowires may be arranged in a direction substantially perpendicular to the surface of the substrate, and the nanowires are separated from each other and extend substantially parallel to each other. In this way, the nanowire(s) looks like a cantilever relative to the substrate, and the supporting portion looks like an anchor of the cantilever to anchor the nanowire(s) as a cantilever to the substrate.

In order to facilitate removal of the portion of the fin structure, the fin structure may comprise a stack of a sacrificial layer(s) and a nanowire material layer(s) alternately stacked on the substrate. For example, the sacrificial layer(s) and the nanowire material layer(s) may be formed alternately on the substrate, and then they may be patterned into a fin structure. The patterning step may be carried out into the substrate, so that a protrusion may be formed on the substrate at a position corresponding to the fin structure. Then, the material layer(s) may be selectively removed.

As the nanowire is suspended and thereby surfaces thereof are exposed, a semiconductor layer may be grown on the surfaces. Then, in a case of sufficient growth, all of the surfaces of the nanowire (exposed by the supporting portion) may be covered by the semiconductor layer. This semiconductor layer may then act as the fin of the device.

Alternatively, a mask layer may be formed between the substrate and one semiconductor layer closest to the substrate as well as between the respective semiconductor layer(s). In this way, the respective semiconductor layer(s) may be etched with the nanowire(s) and the mask layer as a mask, so that portions of the semiconductor layer(s) are remained between the respective nanowire(s) and the mask layer. The remaining portions of the semiconductor layer(s) may look like nanowires, and may then act as a fin of the device.

There are various ways to manufacture the device based on the fin. For example, an isolation layer may be formed on the substrate, and a gate stack intersecting the semiconductor layer may be formed on the isolation layer. The isolation layer may have a top surface lower than the lowest bottom surface of the semiconductor layer(s), thereby exposing the respective semiconductor layer(s). The isolation layer may be formed by depositing a dielectric layer such as an oxide layer and then etching it back. The supporting portion may have a different material from that of the isolation layer, and thus will not be damaged during the back etching.

The present disclosure may be implemented in various forms, and some examples thereof will be described below.

As shown in FIG. 1, a substrate 1001 is provided. The substrate 1001 may be a substrate in any form, for example, but not limited to, a bulk semiconductor substrate such as a bulk silicon (Si) substrate or the like. Hereinafter, the bulk Si substrate will be described by way of example for convenience of description.

A sacrificial layer 1003-1, a nanowire material layer 1005-1, a sacrificial layer 1003-2 and a nanowire material layer 1005-2 are formed in sequence on the substrate 1001 by, for example, epitaxy. The sacrificial layers 1003-1 and 1003-2 may comprise a different semiconductor material from those of the substrate 1001 and the nanowire material layers 1005-1 and 1005-2, for example, SiGe (wherein Ge may have an atomic percentage of, for example, about 5-20%). The sacrificial layer 1003-1 may have a thickness of about 10-100 nm, and the sacrificial layer 1003-2 may have a thickness of about 10-50 nm (the thicknesses of the sacrificial layers may be determined depending on a desired distance between a nanowire and the substrate as well as a desired distance between two neighboring nanowires). The nanowire material layers 1005-1 and 1005-2 may comprise a suitable semiconductor material, for example, Si, with a thickness of about 3-10 nm (each nanowire material layer's thickness may depend on a desired height of the nanowires). However, the present disclosure in not limited to the specific number of the sacrificial layers and the specific number of the nanowire material layers, but may include more or less sacrificial layers or nanowire material layers as long as they are alternately stacked on the substrate.

Then, the nanowire material layers and the sacrificial layers (and optionally, the substrate) which are formed in such a way may be patterned to form a fin structure. For example, this can be done as follows.

Specifically, a hard mask layer may be formed on the nanowire material layer 1005-2. In this example, the hard mask layer may comprise an oxide (for example, silicon oxide) layer 1007 and a polysilicon layer 1009. For example, the oxide layer 1007 has a thickness of about 2-10 nm, and the polysilicon layer 1009 has a thickness of about 50-120 nm. In this example, the hard mask is patterned into a fin shape using a pattern transfer technology. To this end, a patterned (for example, through exposure and development) photoresist PR may be formed on the hard mask layer. Here, the photoresist PR is patterned into a strip extending perpendicularly to the sheet, and a width thereof (a dimension in a horizontal direction in the figure) may approximately correspond to a spacing between two fin structures.

Figure 2:
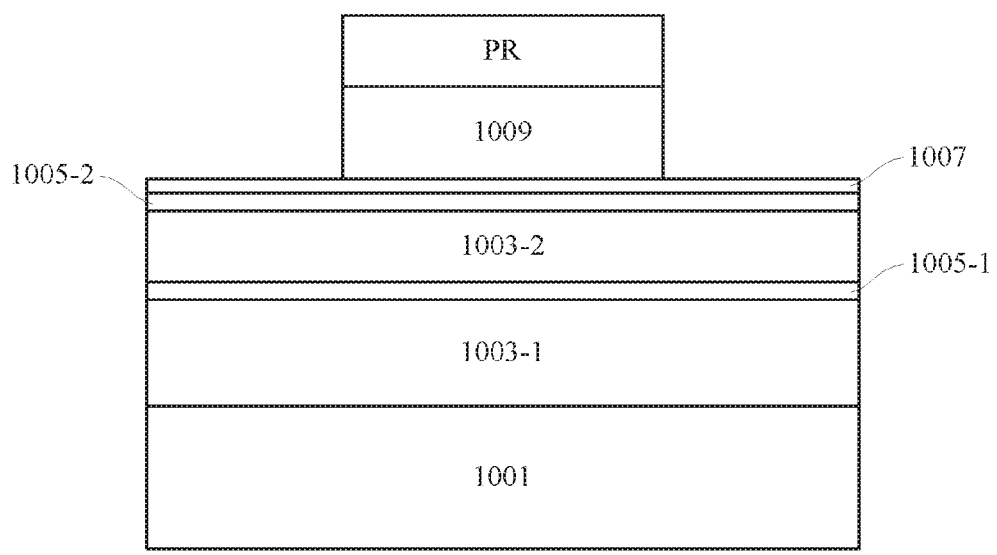
Figure 3A:
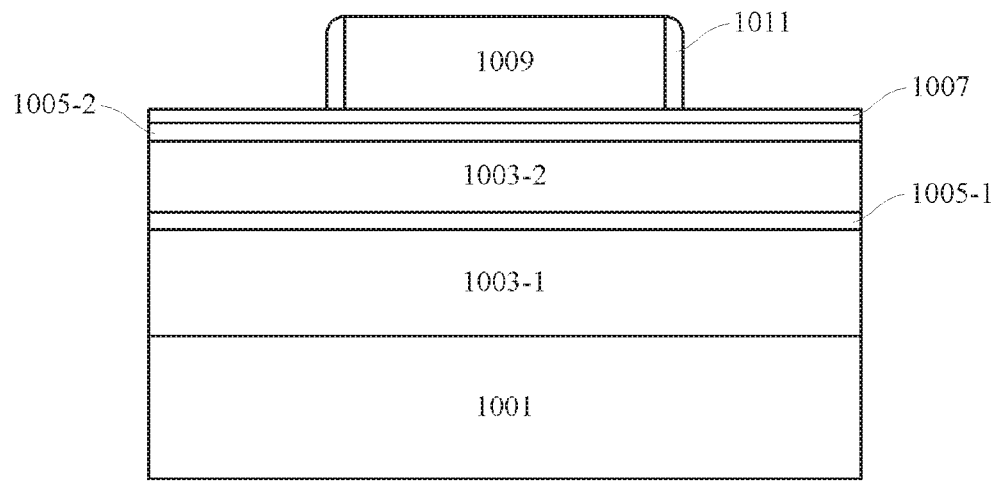

Next, as shown in FIG. 2, the polysilicon layer 1009 is selectively etched (relative to the oxide layer 1007) by, for example, Reactive Ion Etching (RIE) with the photoresist PR as a mask. In this way, the polysilicon layer 1009 may be patterned into a strip corresponding to the photoresist PR. Then, as shown in FIG. 3(a), the photoresist PR is removed and a spacer 1011 is formed on sidewalls of the polysilicon layer 1009. There are various ways in the art to form the spacer. For example, a nitride (for example, silicon nitride) layer with a thickness of about 3-10 nm may be deposited in a substantially conformal way by, for example, Atomic Layer Deposition (ALD), and then the deposited nitride layer may be selectively etched by, for example, RIE, to remove a laterally extending portion thereof so that a vertically extending portion thereof is remained to form the spacer 1011. The spacer 1011 covers the sidewalls of the Si layer 1009.

Figure 3B:
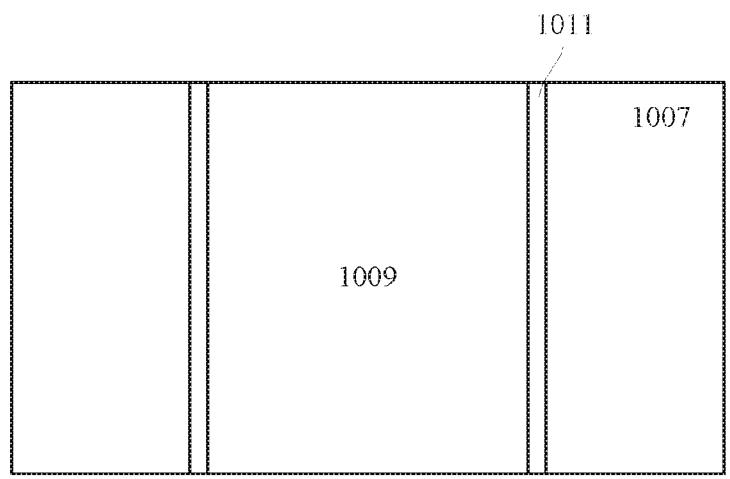

FIG. 3(b) is a top view of the structure illustrated in FIG. 3(a). It is to be noted that the spacer 1011 also exists on upper and lower sidewalls of the strip-shaped polysilicon layer 1009, although not shown in FIG. 3(b), and thereby the spacer 1011 forms a closed pattern surrounding the periphery of the strip-shaped polysilicon layer 1009.

Figure 4A:
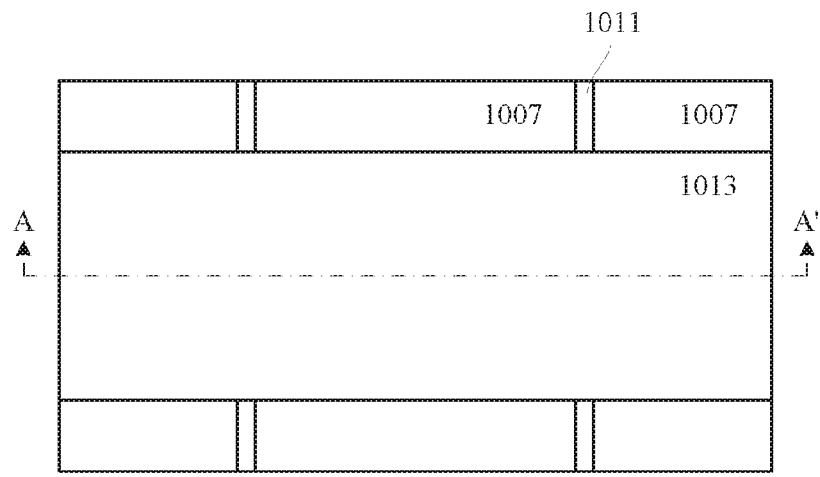
Figure 4B:
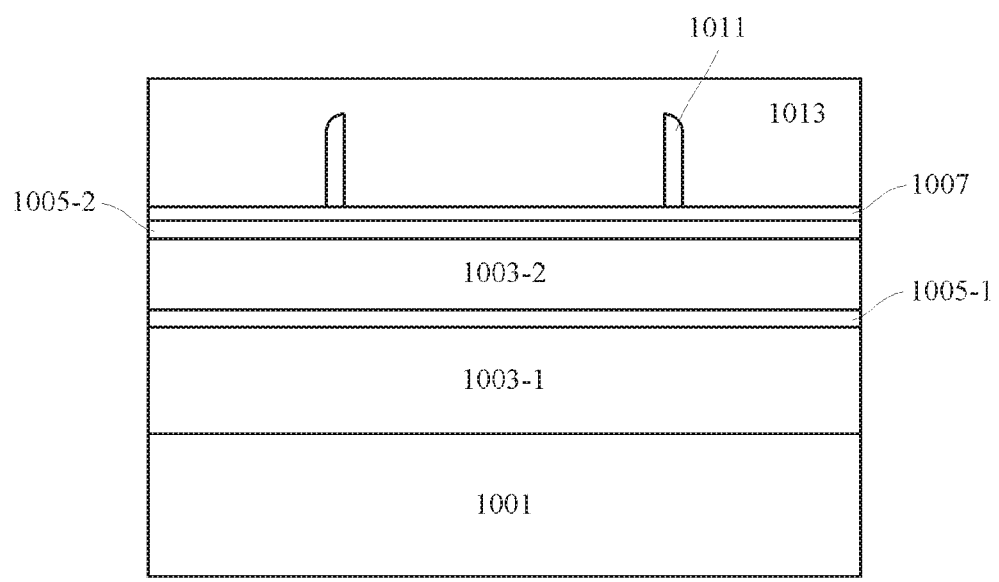
Figure 5:
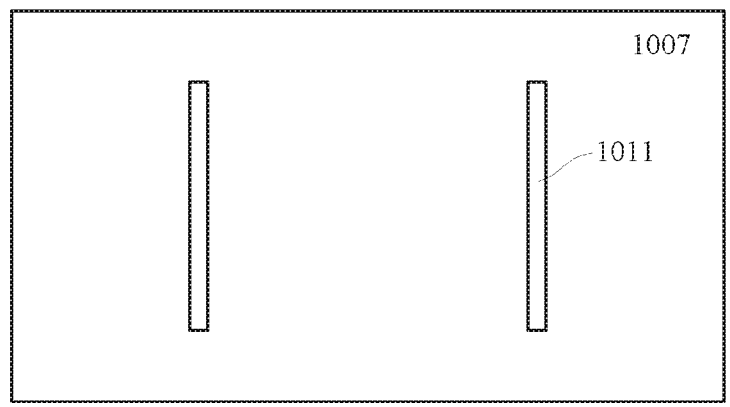

In order to obtain a fin-shaped mask, as shown in FIGS. 4(a) and 4(b) (FIG. 4(a) is a top view, and FIG. 4(b) is a sectional view along line AA' in FIG. 4(a)), the polysilicon layer 1009 may be selectively removed (by, for example, a Tetramethylammonium hydroxide (TMAH) solution), and then a patterned photoresist 1013 is formed. The photoresist 1013 may shield the middle of the spacer 1011, and expose upper and lower portions of the spacer 1011. The spacer 1011 is selectively etched by, for example, RIE, with the photoresist 1013 as a mask, so that the spacer 1011 which is originally in a closed pattern can be separated into two portions, as shown in FIG. 5. Each of those two portions corresponds to a fin structured to be formed, which in this example is a strip extending in a vertical direction in the figure.

Figure 6:
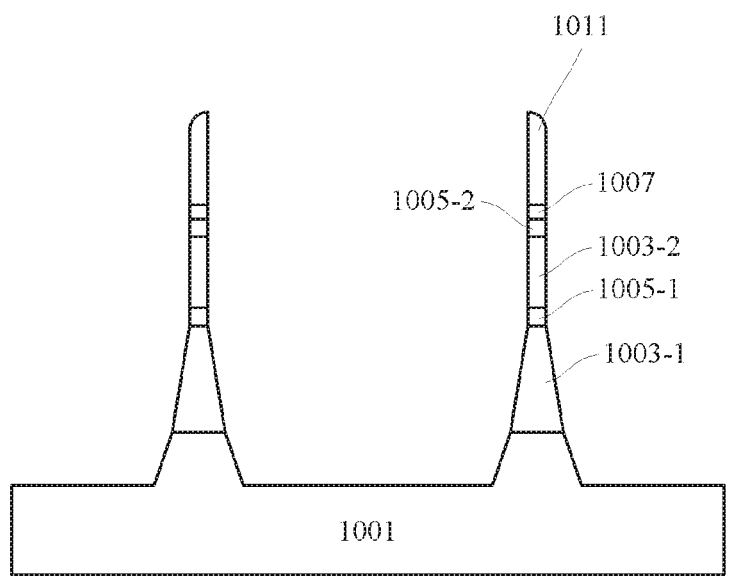

Then, as shown in FIG. 6, the oxide layer 1007, the nanowire material layer 1005-2, the sacrificial layer 1003-2, the nanowire material layer 1005-1, and the sacrificial layer 1003-1 may be selectively etched in sequence by, for example, RIE, with the spacer 1011 as a mask. In this way, the pattern of the spacer 1011 is transferred into the underlying layers, resulting in the fin structure. Therefore, the nanowire material layers 1005-1 and 1005-2, after being etched, each have a width (a dimension in a horizontal direction in the figure) which is approximately the same as that of the spacer 1011 (for example, about 3-10 nm). Here, the substrate 1001 may be further selectively etched. Therefore, the substrate 1001 may have a protrusion thereon at a position corresponding to the fin structure. The fin structure has a projection on the substrate at approximately the middle of the protrusion. Due to characteristics of etching, the etched sacrificial layers 1003 and the protrusion of the substrate 1001 each may have a shape increasingly enlarged from top down. Then, the spacer 1011 may be selectively removed (and the oxide layer 1007 may be further selectively removed).

Although the fin structure is formed by using the pattern transfer technology as described above, the present disclosure is not limited thereto. For example, fin-shaped photoresist may be formed directly on the nanowire material layer 1005-2, and the nanowire material layers, the sacrificial layers and the substrate 1001 can be selectively etched with the photoresist as a mask to form a fin structure. Alternatively, fin-shaped photoresist may be formed directly on the hard mask layer, the hard mask layer can be patterned into a fin shape by using the photoresist, and then the nanowire material layers, the sacrificial layers and the substrate 1001 can be selectively etched in sequence with the fin-shaped hard mask layer to form a fin structure.

Here, although two fin structures are illustrated, the present disclosure is not limited thereto. For example, more or less fin structures may be formed. Further, a layout of the fin structures may be differently designed according to requirements for the device.

Figure 7:
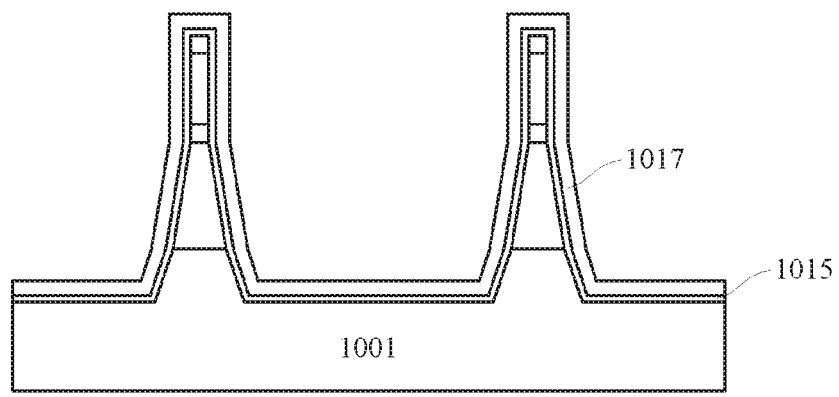

After the fin structure is formed, a supporting portion may be formed. For example, as shown in FIG. 7, an oxide layer 1015 and a nitride layer 1017 may be formed by, for example, ALD in an approximately conformal way on the substrate with the fin structure formed thereon. The oxide layer 1015 may have a thickness of about 1-10 nm, and the nitride layer 1017 may have a thickness of about 2-15 nm. Then, as illustrated in the top view of FIG. 8, patterned photoresist 1019 may be formed on the structure illustrated in FIG. 7. The photoresist 1019 is patterned to cover an end (lower end in the figure) of the fin structure and extend in a horizontal direction in the figure. It is to be noted that in the top view of FIG. 8, the topography of the nitride layer 1017 which fluctuates along with the fin structure on the substrate is not shown merely for convenience, and the same is true for the following top views.

Figure 9A:
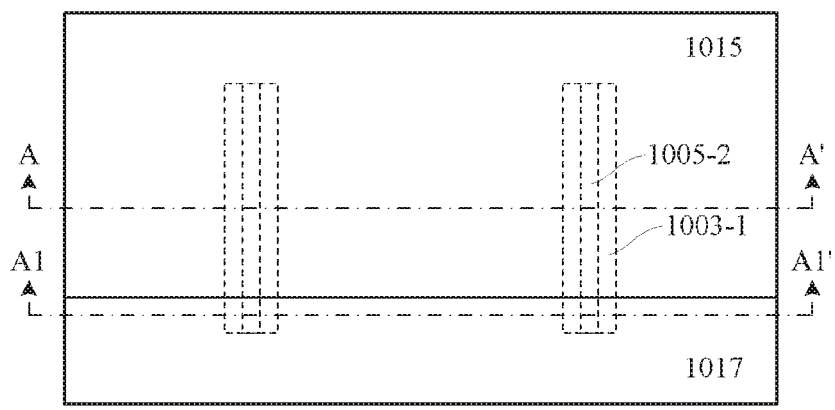
Figure 9B:
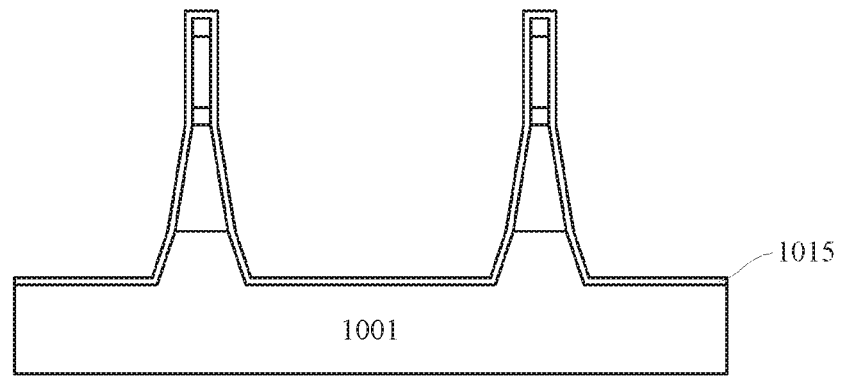
Figure 9C:
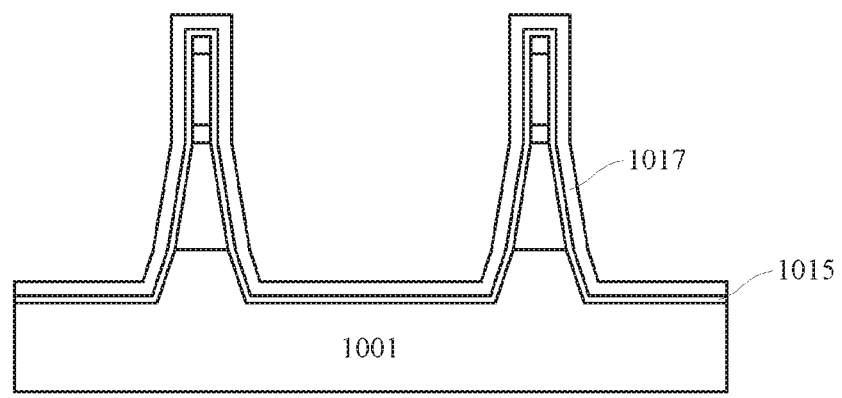

Then, as shown in FIGS. 9(*a*), 9(*b*) and 9(*c*) (FIG. 9(*a*) is a top view, FIG. 9(*b*) is a sectional view along line AA' in FIG. 9(*a*), and FIG. 9(*c*) is a sectional view along line A1A1' in FIG. 9(*a*)), the nitride layer 1017 is selectively removed by, for example, RIE (relative to the oxide layer 1015) with the photoresist 1019 as a mask. In this way, as shown in FIG. 9(*c*), the nitride layer 1017 is remained on an end (lower end in the figure) of the fin structure and extends onto the surface of the substrate 1001. In this way, the fin structure is physically connected to the substrate 1001 by the nitride layer 1017, and thus can be supported by the substrate 1001 (particularly after the sacrificial layers 1003-1 and 1003-2 are removed as described below). Then, the photoresist 1019 may be removed.

In the embodiment, a supporting layer which is a stack of the oxide layer and the nitride layer is formed, and the supporting layer is patterned into a supporting portion. However, the present disclosure is not limited thereto. The supporting layer may comprise various suitable dielectric materials. In an embodiment in which the supporting portion is subsequently removed, the supporting layer may even comprise a semiconductor material or a conductive material.

Figure 10A:
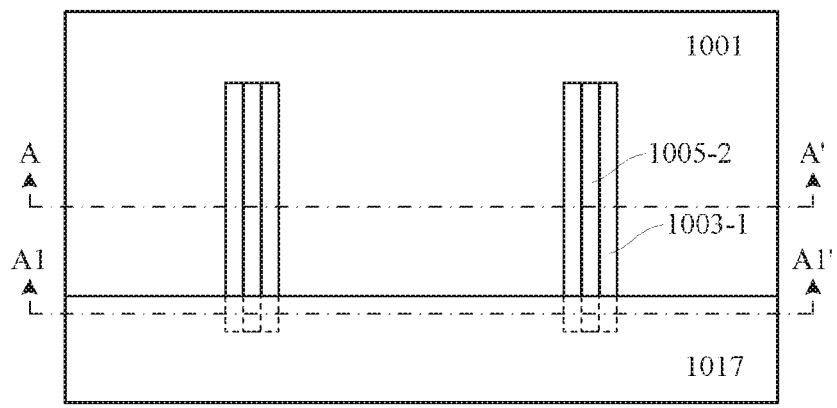
Figure 10B:
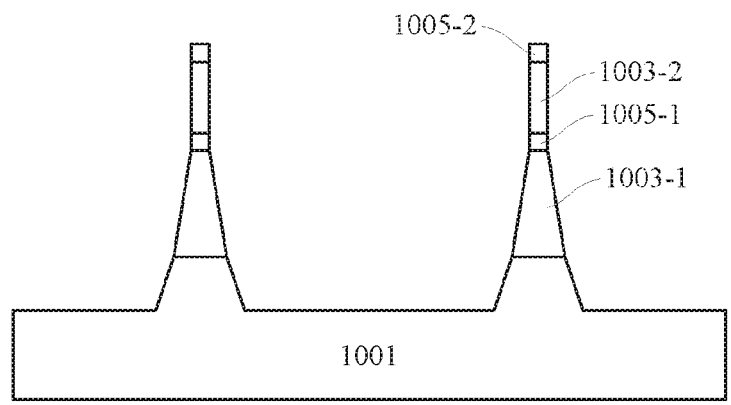
Figure 10C:
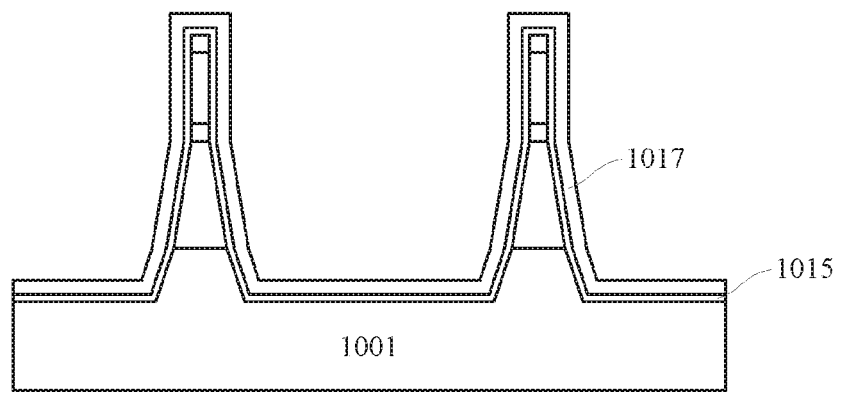
Figure 11A:
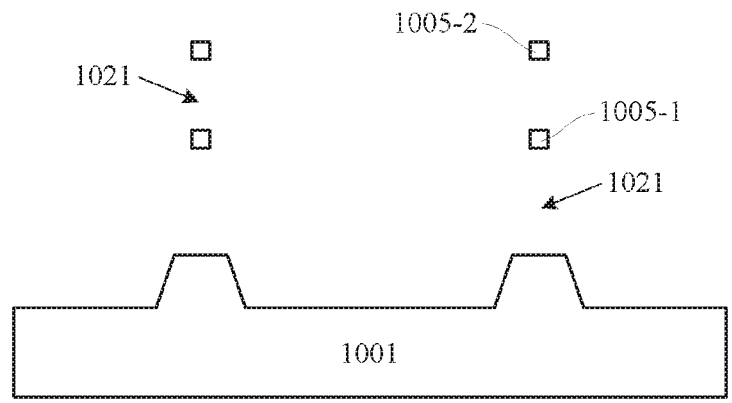
Figure 11B:
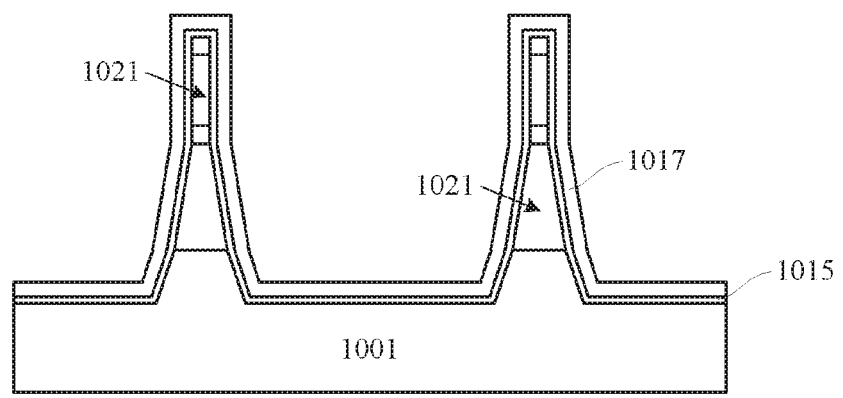

Then, as shown in FIGS. 10(*a*), 10(*b*) and 10(*c*) (FIG. 10(*a*) is a top view, FIG. 10(*b*) is a sectional view along line AA' in FIG. 10(*a*), and FIG. 10(*c*) is a sectional view along line A1A1' in FIG. 10(*a*)), the oxide layer 1015 may be selectively removed by, for example, RIE (relative to the substrate 1001 and the nanowire material layers of Si and the sacrificial layers of SiGe). As shown in FIGS. 10(*a*) and 10(*c*), the oxide layer 1015 is covered by the nitride layer 1017 and thus can be remained on the lower end of the fin structure. Then, as shown in FIGS. 11(*a*) and 11(*b*) (sectional views corresponding to those of FIGS. 10(*b*) and 10(*c*), respectively), the sacrificial layers 1003-1 and 1003-2 may be selectively removed by, for example, wet etching (relative to the substrate 1001 and the nanowire material layers 1005-1 and 1005-2 of Si). In this way, a spacing 1021 between the nanowire material layer 1005-1 and the substrate 1001 as well as between the nanowire material layers 1005-1 and 1005-2 is formed. Thereby, nanowire structures may be formed by means of the nanowire material layers 1005-1 and 1005-2, respectively.

Figure 12:
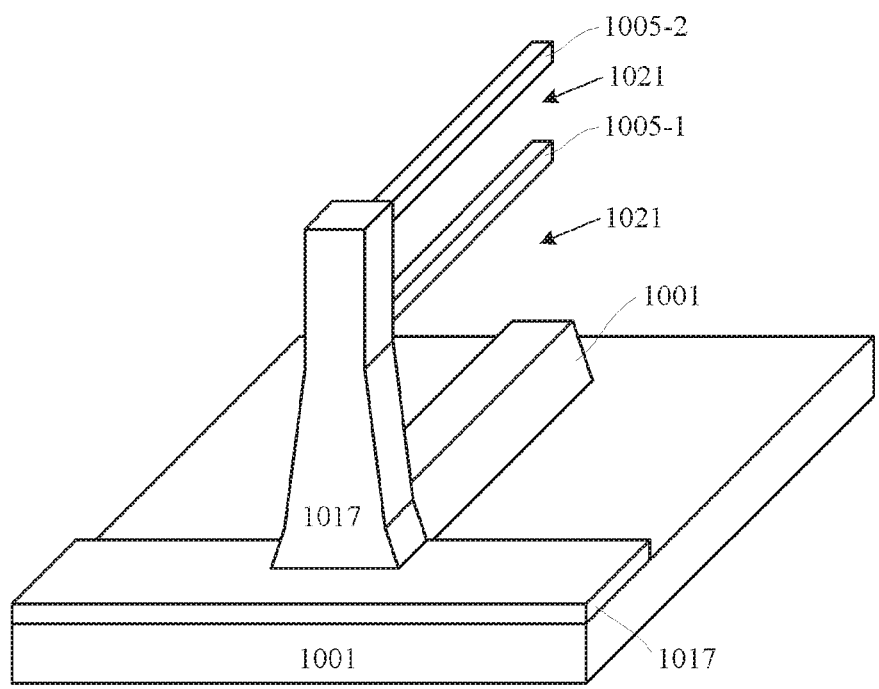

FIG. 12 is a perspective view of the structure illustrated in FIG. 11. As shown in FIG. 12, the nanowires 1005-1 and 1005-2 are spaced apart from the substrate 1001 and also spaced apart from each other by the spacing 1021, and are supported by the substrate 1001 via the supporting portion 1015/1017. The nanowires 1005-1 and 1005-2 are arranged in a direction substantially perpendicular to the surface of the substrate (in this example, in a substantially vertical direction), and are aligned with respect to each other. In FIG. 12, merely for convenience, only two nanowires aligning with respect to each other in a substantially vertical direction and the corresponding supporting portion are illustrated, and the residual oxide layer 1015 is not shown.

The supporting portion 1015/1017 comprises a laterally extending portion which extends on the surface of the substrate 1001 and a vertically extending portion which extends in a direction approximately perpendicular to the surface of the substrate. In this example, the vertically extending portion may comprise a portion extending along surfaces of the protrusion of the substrate 1001, a portion extending along surfaces of the sacrificial layers (which have been removed) and also a portion extending along the vertical sidewalls of the nanowires 1005-1 and 1005-2. In this way, the supporting portion 1015/1017 physically connects the nanowires 1005-1 and 1005-2 to the substrate

1001, and thus can support the nanowires 1005-1 and 1005-2. The supporting portion 1015/1017 may extend on the vertical sidewalls of the nanowires 1005-1 and 1005-2 on opposite sides (left side and right side in the figure), so as to sandwich the respective nanowires, thereby more stably supporting the nanowires. Of course, in this example, the supporting portion 1015/1017 may further extend on an end of the nanowires 1005-1 and 1005-2 facing the reader. A portion of the nanowires 1005-1 and 1005-2 connected to the supporting portion 1015/1017 may have an extent in a longitudinal direction of the nanowires 1005-1 and 1005-2 less than a length of the nanowires 1005-1 and 1005-2 in the longitudinal direction. Here, the so-called "longitudinal direction" refers to a length direction of the nanowires (a direction perpendicular to the sheet in FIG. 11), which is substantially the same as a length direction of a channel which is then formed. In this way, the nanowires 1005-1 and 1005-2 each look like a cantilever relative to the substrate 1001, and the cantilever is anchored to the substrate 1001 by the supporting portion 1015/1017.

In the above example, in addition to the nitride layer 1017, the supporting portion further comprises the oxide layer 1015. However, the present disclosure is not limited thereto. For example, in the operation described above in conjunction with FIG. 7, the oxide layer 1015 may not be formed, and instead, only the nitride layer 1017 is formed. In this way, subsequent operations may also be implemented in the manner described above in conjunction with FIGS. 8-11. Of course, the supporting portion may also comprise other dielectric material or a different stack.

In addition, in the above example, for the two fin structures, the supporting portion is formed on their respective lower ends. However, the present disclosure is not limited thereto. For example, for one fin structure, the supporting portion may be formed on its lower end as described above; while for the other fin structure, the supporting portion may be formed at a different position, for example, on its upper end, as described below.

Figure 8:
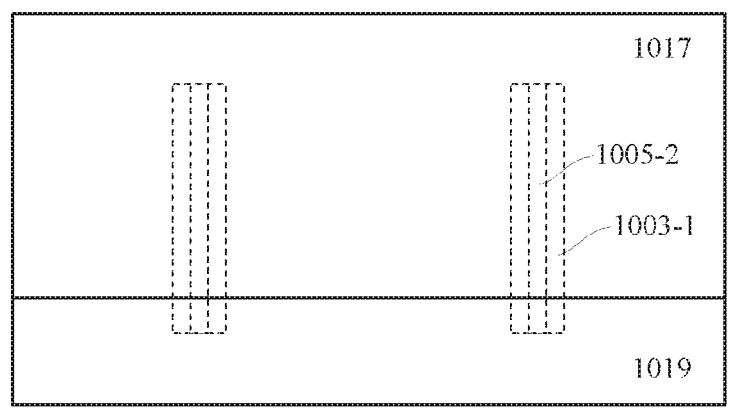

In addition, the mask 1019 which is used to pattern the supporting portion (as shown in FIG. 8) is not limited to the above shape. Generally, the mask may extend on the fin structure beyond an extent of the fin structure in a direction perpendicular to a longitudinal direction of the fin structure. In this way, the mask may cover a portion of the nitride layer 1017 extending on the surface of the substrate 1001 (except for the protrusion), and thus this portion can then be remained (as a base of the supporting portion). On the other hand, the mask may cover only a fraction of a length of the fin structure in the longitudinal direction. In this way, a configuration similar to a cantilever-anchor structure may be formed.

Figure 13A:
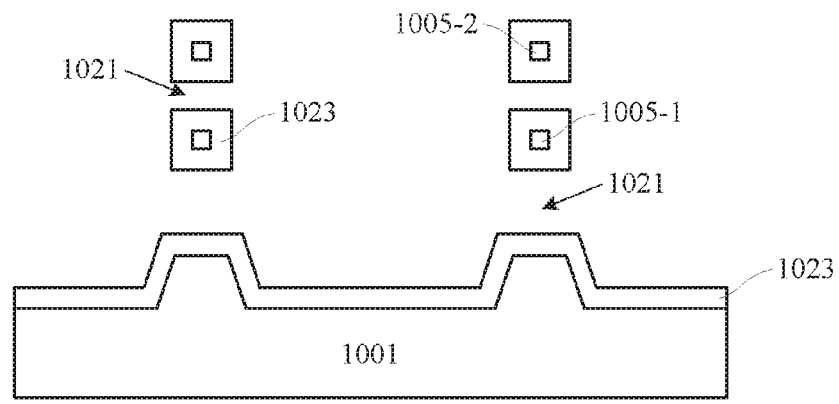
Figure 13B:
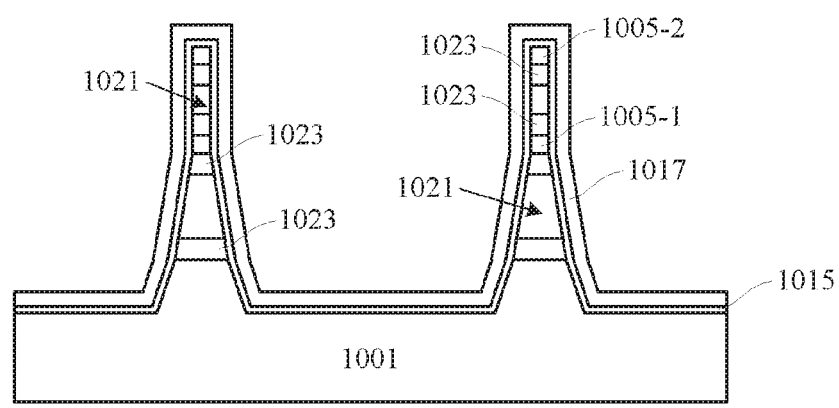

Then, as shown in FIGS. 13(*a*) and 13(*b*) (sectional views corresponding to those of FIGS. 11(*a*) and 11(*b*), respectively), a semiconductor layer 1023 may be grown on the nanowires 1005-1 and 1005-2. Here, the semiconductor layer 1023 may comprise a material of high mobility, for example, Ge, SiGe, or a III-V compound semiconductor, such as InSb, InGaSb, InAs, GaAs, InGaAs, AlSb, InP, group-III nitride or the like, with a thickness of about 3-20 nm. In a case of the compound semiconductor such as SiGe, components thereof (for example, an atomic percentage of Ge) may change gradually, so that the compound semiconductor has a lattice constant which changes from being similar to a lattice constant of the nanowires 1005-1 and 1005-2 (here, Si) to being more different from the lattice constant of the nanowires 1005-1 and 1005-2, to suppress dislocations or defects.

The growth may be selective growth, so that the semiconductor layer 1023 is grown only on the surfaces of the nanowires 1005-1 and 1005-2 (and also the substrate 1001) of the semiconductor material. The growth of the semiconductor layer 1023 may be controlled so that the semiconductor layer 1023 does not completely fill the spacing 1021 between the nanowire 1005-1 and the substrate 1001 as well as between the respective nanowires 1005-1 and 1005-2. In addition, as stated below, the remaining spacing 1021 is sufficient to form a gate dielectric layer (and optionally a work function adjustment layer). Due to the suspension configuration of the nanowires 1005-1 and 1005-2, stresses in the nanowires 1005-1 and 1005-2 and the semiconductor layer 1023 can be relaxed in the growth process. In this way, it is possible to suppress or even avoid defects occurring in the nanowires 1005-1 and 1005-2 or the semiconductor layer 1023, which contributes to improve performances of the device (for example, reduce an off-state leakage current or increase an on-state current).

In this example, the nanowires 1005-1 and 1005-2 have portions of their respective surfaces, other than those covered by the supporting portion 1015/1017, covered by the semiconductor layer. Of course, the semiconductor layer 1023 may also be grown on the surface of the substrate 1001.

In this example, each of the nanowires has an extent in its longitudinal direction, other than that covered by the supporting portion, in which the periphery of the nanowire is completely encapsulated by the semiconductor layer 1023. In this way, in a cross section (i.e., the cross section illustrated in FIGS. 13(*a*) and 13(*b*)) perpendicular to the longitudinal direction of the nanowire, the semiconductor layer 1023 forms a closed pattern (which is a rectangle in this example). Of course, the closed pattern is decided by a pattern of the nanowire in the cross section, and may be in a different shape such as a polygon.

The second semiconductor layer 1023 in such a shape can act as a fin of the device.

After the fin 1023 is formed in the above processes, a gate stack intersecting the fin may be formed, resulting in the final semiconductor device (for example, FinFET).

Figure 14A:
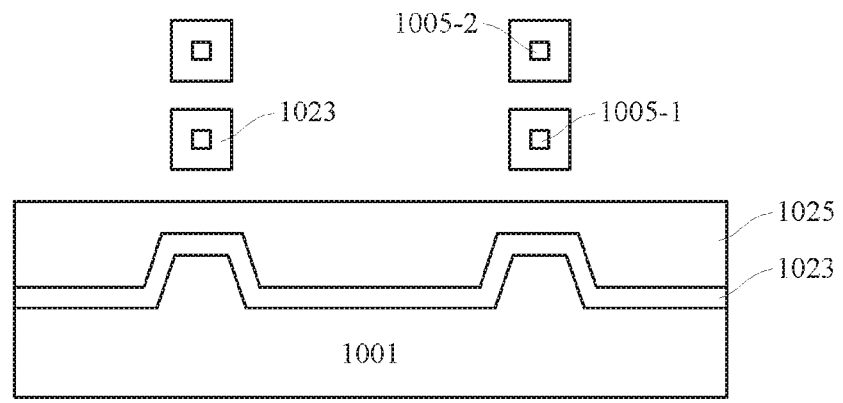
Figure 14B:
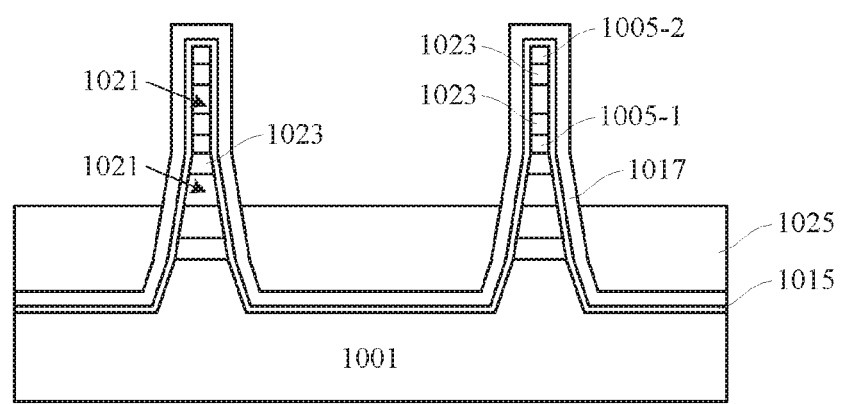

In order to isolate the gate stack from the substrate, as shown in FIGS. 14(*a*) and 14(*b*) (sectional views corresponding to those of FIGS. 13(*a*) and 13(*b*), respectively), an isolation layer 1025 is firstly formed on the substrate 1001 (in this example, on the semiconductor layer 1023 formed on the substrate 1001). This isolation layer may be formed by, for example, depositing a dielectric material such as oxide on the substrate and then etching it back. In the back-etching process, a back-etching depth is controlled so that the resultant isolation layer 1025 can expose the semiconductor layer 1023 formed around the respective nanowires.

Figure 15:
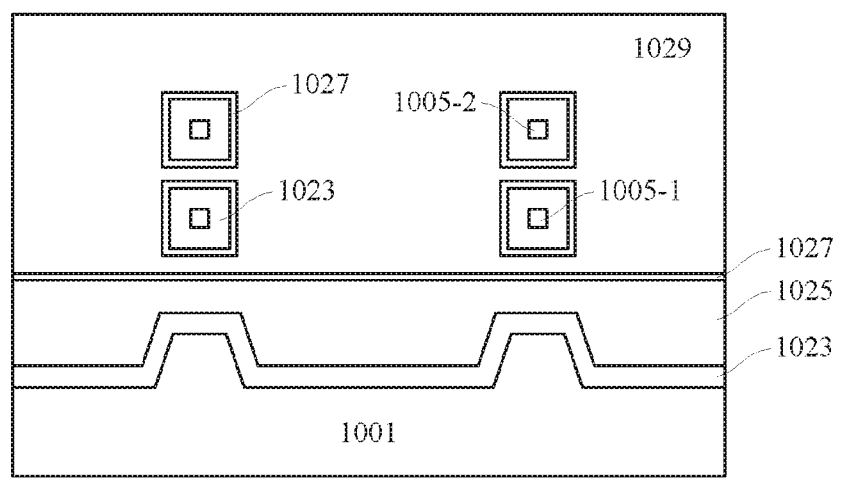

Then, the gate stack intersecting the fin may be formed on the isolation layer 1025. For example, this may be down as follows. Specifically, as shown in FIG. 15 (a sectional view corresponding to that of FIG. 14(*a*)), a gate dielectric layer 1027 and a gate conductor layer 1029 may be formed in sequence. For example, the gate dielectric layer 1027 may comprise oxide (for example, $SiO_2$ or $GeO_2$) with a thickness of about 0.3-2 nm, and the gate conductor layer 1029 may comprise polysilicon. Alternatively, the gate dielectric layer 1027 may comprise a high-K gate dielectric such as $HfO_2$ or $Al_2O_3$ with a thickness of about 1-4 nm, and the gate conductor layer 1029 may comprise a metallic gate conductor. In a case of high-K gate dielectric/metallic gate conductor, a work function adjustment layer (not shown), for example, TiN, Al, Ti, TiAlC, with a thickness of about 1-3 nm may be further formed between the gate dielectric layer 1027 and the gate conductor layer 1029.

Due to the suspended state of the nanowires 1005-1 and 1005-2, the gate dielectric layer 1027 may be formed to at least partially surround a periphery of each of the nanowires. Also, such a gate dielectric layer material may be formed on a surface of the isolation layer 1025. Moreover, in a case of forming the work function adjustment layer, similarly, it may be formed to at least partially surround a periphery of each gate dielectric layer. Also, such a work function adjustment layer material may be formed on the gate dielectric layer material formed on the isolation layer 1025. In the region covered by the supporting portion (as illustrated in FIG. 13(*b*)), the spacing 1021 may be filled with the gate dielectric layer material, the work function adjustment layer material and the gate conductor layer material.

In this example, gate stacks of devices based on the two left fins are shown to have the same configuration as gate stacks of devices based the two right fins, and extend as a whole, merely for convenience of illustration. However, the present disclosure is not limited thereto. The two devices may have different gate stack configurations (for example, a gate stack of an n-type device may be different from a gate stack of a p-type device), and respective gate stacks may be patterned according to a layout of the devices.

After the gate stack is formed, halo implantation and extension implantation may be performed with the gate stack as a mask, for example. Next, a gate spacer may be formed on sidewalls of the gate stack. Then, source/drain (S/D) implantation may be performed with the gate stack and the gate spacer as a mask. Then, implanted ions may be activated through annealing to form source/drain regions.

There are various ways to manufacture a device based on a fin, and processes after formation of the fin will not be described in detail here.

In this way, the semiconductor device according to the embodiment is obtained. As shown in FIG. 15, the semiconductor device may comprise at least one nanowire (1005-1, 1005-2) spaced apart from the substrate 1001 but physically connected to the substrate 1001 by the supporting portion 1015/1017 (as shown in FIG. 12). The second semiconductor layer 1023 is formed to surround the periphery of the respective nanowire(s) and acts as a fin of the device. In addition, the device further comprises the isolation layer 1025 and the gate stack (1027, 1029) formed on the isolation layer 1025 and intersecting the fin 1023. The gate stack may at least partially surround the fin 1023.

In the embodiment, in the final device, the supporting portion is remained. However, the present disclosure is not limited thereto. The supporting portion may be selectively (at least partially) removed (for example, after the gate stack is formed), and a space resulting from the removal of the supporting portion may be filled with, for example, another dielectric layer.

Figure 16:
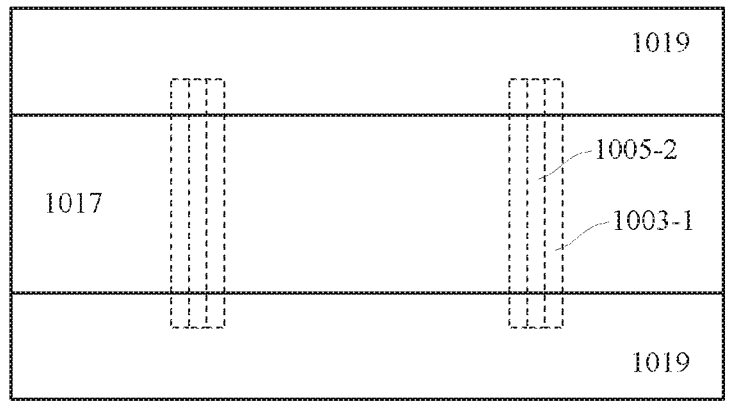
FIGS. 16-17 are schematic views illustrating some steps in a flow of manufacturing a semiconductor device according to another embodiment of the present disclosure.
Figure 17:
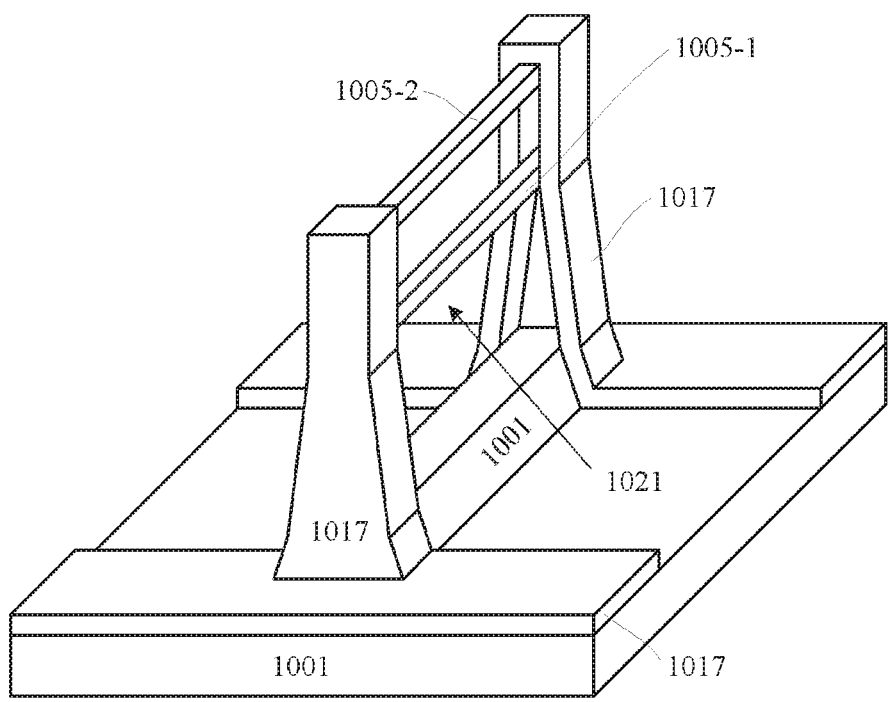

In the above embodiment, the supporting portion is formed only on one end of the nanowire. However, the present disclosure is not limited thereto, and the supporting portion may be formed on opposite ends of the nanowire, respectively. For example, instead of the operation described above in conjunction with FIG. 8, as shown in FIG. 16, the photoresist 1019 is patterned to cover opposite ends (upper and lower ends in the figure) of the fin structure, and extend in a horizontal direction in the figure. Subsequent operations may be performed in the same manner as described above. In this case, a suspension structure illustrated in FIG. 17 may be obtained. In particular, as shown in FIG. 17, each of the nanowires 1005-1 and 1005-2 is suspended relative to the substrate 1001, and opposite ends of each of the nanowires 1005-1 and 1005-2 are supported by the substrate 1001 via the supporting portion 1017.

Figure 18:
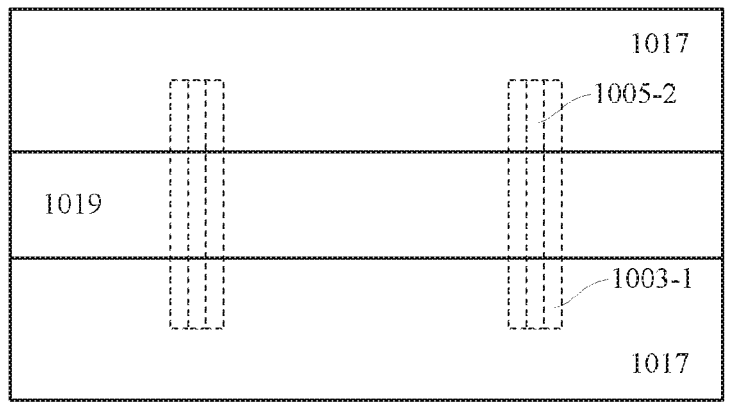
FIGS. 18-19 are schematic views illustrating some steps in a flow of manufacturing a semiconductor device according to a further embodiment of the present disclosure.
Figure 19:
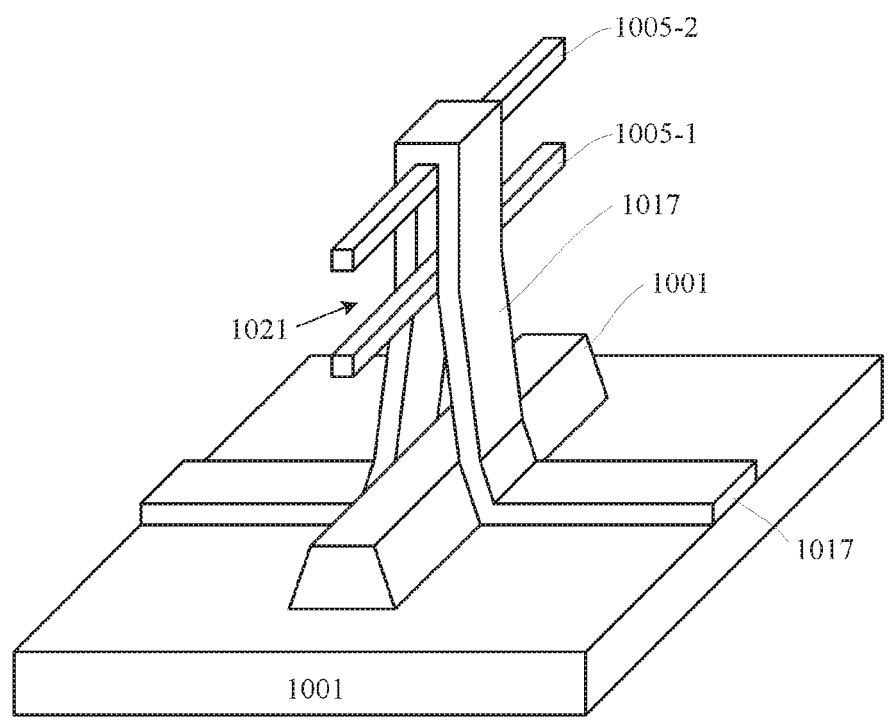

Of course, the supporting portion is not limited to be formed on the end(s) of the nanowire, and may be formed at any position in the longitudinal extent of the nanowire. For example, instead of the operation described above in conjunction with FIG. 8, as shown in FIG. 18, the photoresist 1019 is patterned to cover the middle of the fin structure, and extend in a horizontal direction in the figure. Subsequent operations may be performed in the same manner as described above. In this case, a suspension structure illustrated in FIG. 19 may be obtained. In particular, as shown in FIG. 19, each of the nanowires 1005-1 and 1005-2 is suspended relative to the substrate 1001, and the middle of each of the nanowires 1005-1 and 1005-2 is supported by the substrate 1001 via the supporting portion 1017.

FIGS. 20-24 are views illustrating some steps in a flow of manufacturing a semiconductor device according to a still further embodiment of the present disclosure. The following descriptions will focus on differences of the present embodiment from the above embodiments.

First of all, as done in the above embodiments, nanowires 1005-1 and 1005-2 are formed on a substrate 1001 and semiconductor layers 1023 are grown with the respective one of the nanowires as a seed, as illustrated in conjunction with FIGS. 1-13(*b*). In this embodiment, the substrate 1001 may have a surface being a (111) or (110) crystal plane. Moreover, the top nanowire material layer 1005-2 may have a relatively large thickness, e.g., about 3-20 nm, because the layer will subsequently serve as a mask.

Since the surface of the substrate 1001 may be a (111) or (110) crystal plane, top and bottom surfaces of the nanowires 1005-1 and 1005-2 may also be (111) or (110) crystal planes. Then, these two surfaces may facilitate the growth of the semiconductor layer 1023.

Figure 20:
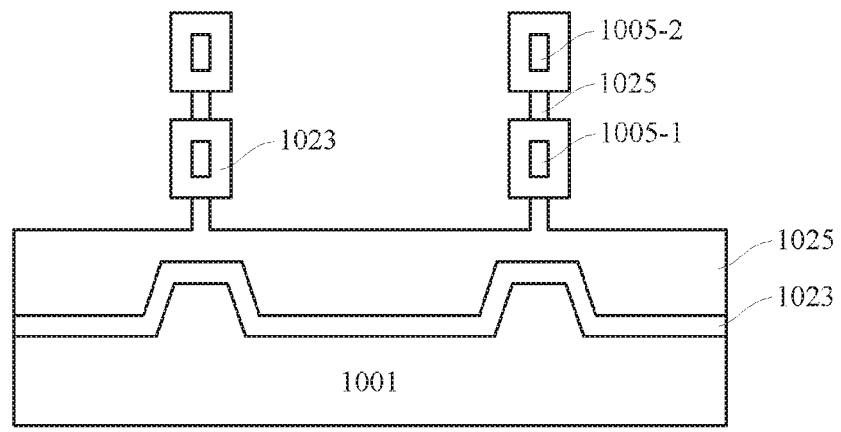
FIGS. 20-24 are schematic views illustrating some steps in a flow of manufacturing a semiconductor device according to a still further embodiment of the present disclosure.

Unlike the operations of forming the isolation layer as described in the above embodiments in conjunction with FIGS. 14(*a*) and 14(*b*), when etching back the isolation layer, as illustrated in FIG. 20, portions of the isolation layer between the lowest semiconductor layer 1023 and the substrate as well as between respective semiconductor layers 1023 are not completely removed. These remaining portions of the isolation layer 1025 may be implemented, e.g., by an undercut in the etching, and then may serve as a mask layer. The amount of the etching may be controlled in such a manner that the mask layer has a width substantially the same as that of the nanowires 1005-1 and 1005-2.

It is to be noted that, while the mask layer is formed along with the back etching of the isolation layer, the present disclosure is not limited thereto. For example, the isolation layer can be formed as shown in FIGS. 14(*a*) and 14(*b*), and then an additional dielectric layer (e.g., a nitride layer) can be formed on top of the isolation layer. The nitride layer can be selectively etched (thus forming an undercut) to obtain the mask layer as shown in FIG. 20.

Figure 21:
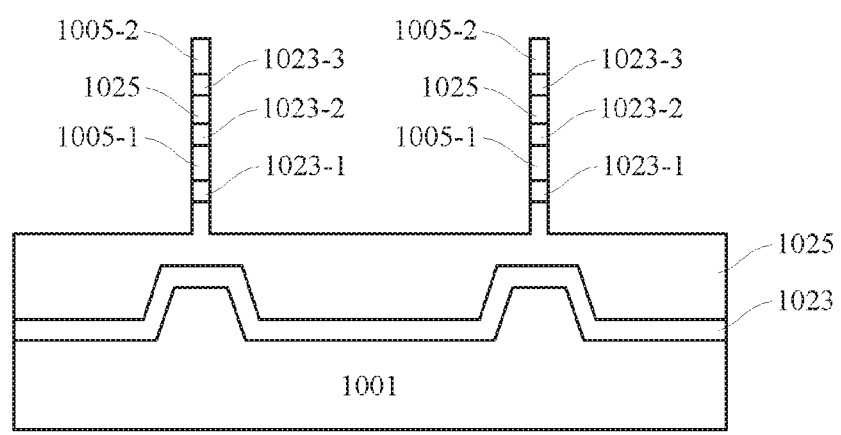

Next, as shown in FIG. 21, the nanowires and the mask layer can be used as masks for selectively etching (e.g., RIE) the semiconductor layers 1023. Hence, portions of the semiconductor layers 1023 between the respective nanowires and the mask layer can be left. Accordingly, the remaining portions 1023-1, 1023-2 and 2013-3 of the semiconductor layers 1023 can also be in a nanowire shape. The nanowires 1023-1 and 1023-2 obtained from one single semiconductor 1023 can have a crystalline structure in mirror symmetry relative to a middle line therebetween.

Figure 22:
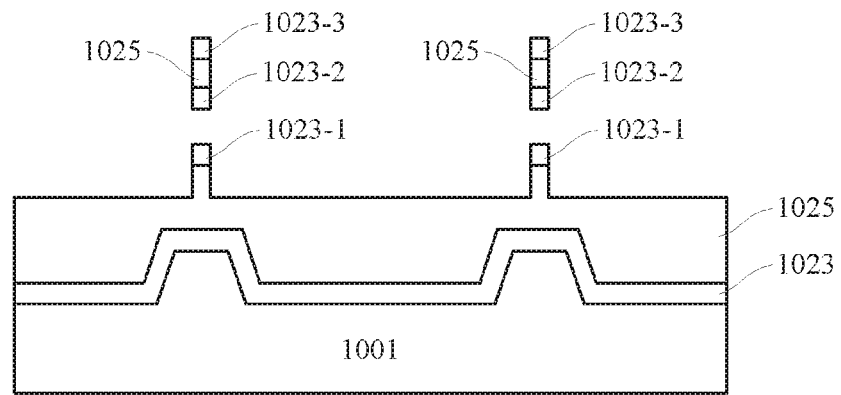
Figure 23:
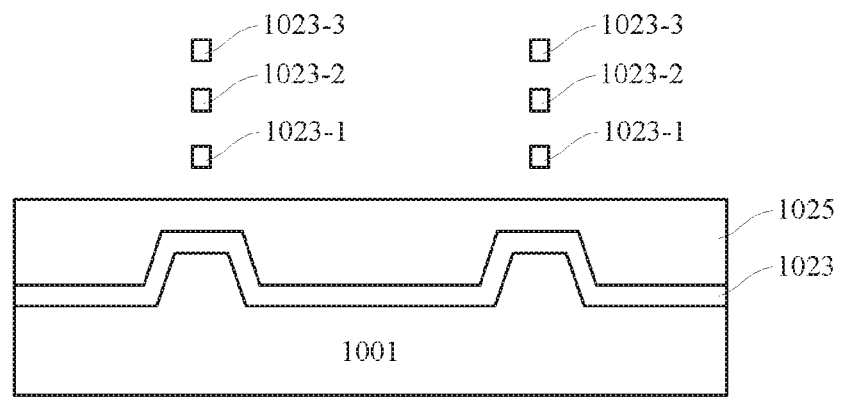

Then, as shown in FIG. 22, the nanowires 1005-1 and 1005-2 can be selectively removed by means of selectively etching (e.g., RIE). Also, as shown in FIG. 23, the mask layer 1025 can be removed by means of selectively etching (e.g., RIE) (e.g., wet etching), to obtain the suspended nanowires 1023-1, 1023-2 and 2013-3. These nanowires are supported by the support portion at their ends or the middle thereof, as described above.

These nanowires 1023-1, 1023-2 and 2013-3 each may serve as a fin of a device. Such a fin-based device has been described above and the details thereof will be omitted here.

Figure 24:
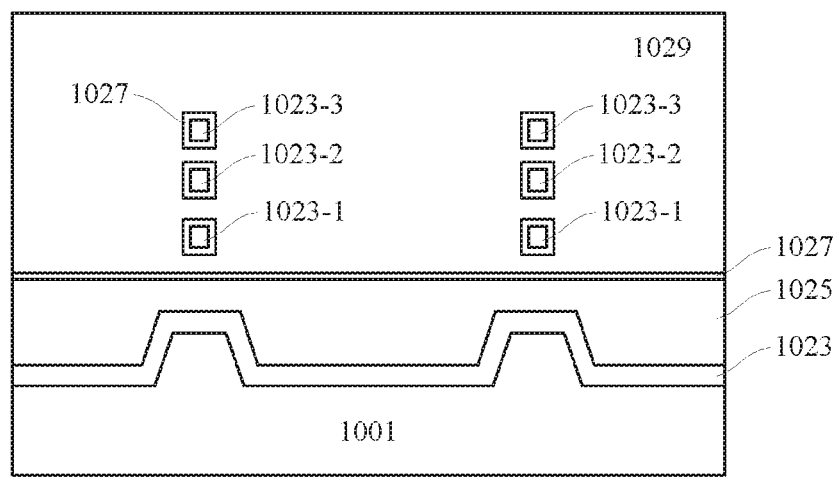

In this way, the semiconductor device according to this embodiment can be obtained. As shown in FIG. 24, the semiconductor device can include a plurality of nanowires 1023-1, 1023-2 and 2013-3 spaced apart from the substrate 1001. These nanowires each may comprise a material of high mobility to serve as a fin of the device. Further, the device further includes an isolation layer 1025 and a gate stack (1027, 1029) formed on the isolation layer 1025 and intersecting the respective fins. The gate stack can at least partially surround the respective fins 1023.

The semiconductor devices according to the embodiments of the present disclosure are applicable to various electronic devices. For example, an Integrated Circuit (IC) may be formed by integrating a plurality of such semiconductor devices and other devices (for example, transistors in other forms or the like), from which an electronic device may be made. Therefore, the present disclosure further provides an electronic device comprising the above semiconductor device. The electronic device may also comprise components such as a display operatively coupled to the integrated circuit and a wireless transceiver operatively coupled to the integrated circuit, or the like. Such an electronic device may comprise, for example, a smart phone, a tablet Personal Computer (PC), a Personal Digital Assistant (PDA), or the like.

According to an embodiment of the present disclosure, there is also provided a method of manufacturing a System on Chip (SoC), The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided only for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

I claim:

1. A semiconductor device, comprising:
   a substrate;
   at least one nanowire spaced apart from the substrate;
   at least one semiconductor layer, each formed around a periphery of respective one of the at least one nanowire to completely surround the corresponding nanowire in a cross section, wherein the at least one semiconductor layer formed around the respective nanowire are separated from each other;
   an isolation layer formed on the substrate, exposing the at least one semiconductor layer; and
   a gate stack formed on the isolation layer and intersecting the at least one semiconductor layer, wherein the gate stack includes a gate dielectric layer and a gate conductor layer, and wherein the gate dielectric layer completely surrounds a periphery of respective one of the at least one semiconductor layer in the cross section,
   wherein the at least one nanowire comprises Si, and the at least one semiconductor layer comprises Ge, SiGe, or a III-V compound semiconductor.

2. The semiconductor device according to claim 1, further comprising a work function adjustment layer completely surrounding a periphery of the gate dielectric layer in the cross section.

3. The semiconductor device according to claim 2, wherein the gate dielectric layer and the work function adjustment layer are stacked in sequence on a surface of the isolation layer, and wherein the gate conductor layer is disposed on the gate dielectric layer and the work function adjustment layer stacked on the surface of the isolation layer.

4. The semiconductor device according to claim 1, wherein there are a plurality of nanowires arranged in a direction substantially perpendicular to a surface of the substrate, and the plurality of nanowires are separated from each other and extend substantially parallel to each other.

5. The semiconductor device according to claim 1, wherein each of the at least one semiconductor layer completely surrounding in the cross section a periphery of respective one of the at least one nanowire is interposed between the respective one of the at least one nanowire and the gate stack.

6. The semiconductor device according to claim 1, further comprising a supporting portion by which each of the at least one nanowire is physically connected to the substrate.

7. The semiconductor device according to claim 6, wherein each of the at least one nanowire has portions of its surface, other than those covered by the supporting portion, covered by the corresponding semiconductor layer.

8. The semiconductor device according to claim 6, wherein a portion of each of the at least one nanowire connected to the supporting portion has an extent in a longitudinal direction of each of the at least one nanowire which is less than a length of each of the at least one nanowire in the longitudinal direction.

9. The semiconductor device according to claim 6, wherein the supporting portion comprises a laterally extending portion extending along a surface of the substrate and a vertically extending portion extending in a direction substantially perpendicular to the surface of the substrate, wherein the vertically extending portion extends onto vertical sidewalls of the respective one of the at least one nanowire which are substantially perpendicular to the surface of the substrate.

10. The semiconductor device according to claim 9, wherein the vertically extending portion of the supporting portion extends on the vertical sidewalls of each of the at least one nanowire on opposite sides to sandwich the respective one of the at least one nanowire.

11. The semiconductor device according to claim 9, wherein
   the substrate has a protrusion at a position corresponding to each of the at least one nanowire, the vertically extending portion of the supporting portion has a part extending along a surface of the protrusion, and a further part extending along the vertical sidewalls of the respective one of the at least one nanowire.

12. The semiconductor device according to claim 6, wherein the supporting portion is positioned at either one or both of opposite ends of each of the at least one nanowire or is positioned in the middle of each of the at least one nanowire.

13. The semiconductor device according to claim 6, wherein the supporting portion comprises a stack of oxide and nitride, and the isolation layer comprises oxide.

14. The semiconductor device according to claim 1, further comprising: another semiconductor layer formed on a surface of the substrate and comprising the same material as that of the at least one semiconductor layer, wherein the isolation layer is formed on the another semiconductor layer.

15. The semiconductor device according to claim 1, wherein, in case where the least one nanowire comprises at least two nanowires spaced apart from the substrate, the at least two nanowires are arranged in a direction substantially perpendicular to a surface of the substrate, and the at least two nanowires are separated from each other and extend substantially parallel to each other, and among them, at least one pair of neighboring nanowires have a crystalline structure in mirror symmetry relative to a middle line therebetween.

* * * * *